(12) United States Patent
Park et al.

(10) Patent No.: US 10,964,246 B2
(45) Date of Patent: Mar. 30, 2021

(54) FOLDABLE DISPLAY DEVICE AND METHOD OF DRIVING THE SAME

(71) Applicant: LG Display Co., Ltd., Seoul (KR)

(72) Inventors: Sung-Bin Park, Paju-si (KR); Zong-Gun Oh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/715,839

(22) Filed: Dec. 16, 2019

(65) Prior Publication Data

US 2020/0211438 A1 Jul. 2, 2020

(30) Foreign Application Priority Data

Dec. 28, 2018 (KR) ........................ 10-2018-0172127

(51) Int. Cl.
| | |
|---|---|
| *G09G 3/20* | (2006.01) |
| *G01B 7/14* | (2006.01) |
| *G02F 1/1333* | (2006.01) |
| *G02F 1/1362* | (2006.01) |
| *H01L 27/12* | (2006.01) |
| *H01L 51/00* | (2006.01) |
| *H01L 27/32* | (2006.01) |

(52) U.S. Cl.
CPC ................ *G09G 3/20* (2013.01); *G01B 7/14* (2013.01); *H01L 27/124* (2013.01); *G02F 1/133305* (2013.01); *G02F 1/136286* (2013.01); *G09G 2310/0291* (2013.01); *G09G 2310/08* (2013.01); *G09G 2380/02* (2013.01); *H01L 27/3276* (2013.01); *H01L 51/0097* (2013.01); *H01L 2251/5338* (2013.01)

(58) Field of Classification Search
CPC ...... G06F 3/044; G06F 1/1616; G06F 1/1618; G06F 1/162; G06F 1/1641; G06F 1/1652; G06F 1/1677; G06F 2203/04102; G02F 1/133305; G09G 2380/02; G09F 9/301; H01L 2251/5338; H01L 51/0097; G01B 7/22; H04M 1/0268
See application file for complete search history.

(56) References Cited

U.S. PATENT DOCUMENTS

| | | | |
|---|---|---|---|
| 9,886,119 B1* | 2/2018 | Arola ..................... | G06F 3/0447 |
| 2015/0022090 A1* | 1/2015 | Kim ....................... | G06F 1/1677 |
| | | | 315/130 |
| 2015/0268783 A1* | 9/2015 | Yoon ..................... | G06F 3/0445 |
| | | | 345/173 |

(Continued)

FOREIGN PATENT DOCUMENTS

KR   10-2017-0064888 A   6/2017

*Primary Examiner* — Nitin Patel
*Assistant Examiner* — Amen W. Bogale
(74) *Attorney, Agent, or Firm* — Birch, Stewart, Kolasch & Birch, LLP (57) ABSTRACT

A foldable display device and a method of driving the same are discussed. The foldable display device can include a display panel having a display area including a plurality of pixels and a non-display area surrounding the display area; a first base pattern in the non-display area; a first capacitive pattern in the non-display area, the first capacitance pattern forming a first capacitance with the first base pattern; a driving unit generating a comparison signal corresponding to the first capacitance; and a calculating unit sensing an unfolding state and a folding state of the display panel using the comparison signal.

12 Claims, 6 Drawing Sheets

(56) References Cited

U.S. PATENT DOCUMENTS

| | | | | |
|---|---|---|---|---|
| 2016/0179260 A1* | 6/2016 | Ham | ................ | G06F 3/0416 |
| | | | | 345/173 |
| 2017/0285837 A1* | 10/2017 | Zeng | ................ | G06F 1/1643 |
| 2019/0121465 A1* | 4/2019 | Seo | ................ | H01L 27/323 |
| 2019/0317621 A1* | 10/2019 | Lee | ................ | G06F 3/0416 |

* cited by examiner

FOLDABLE DISPLAY DEVICE AND METHOD OF DRIVING THE SAME

CROSS-REFERENCE TO RELATED APPLICATIONS

The present application claims the benefit of priority of Korean Patent Application No. 10-2018-0172127 filed on Dec. 28, 2018 in the Republic of Korea, which is hereby incorporated by reference for all purposes as if fully set forth herein.

BACKGROUND

Field of the Invention

The present disclosure relates to a foldable display device. More particularly, the present disclosure relates to a foldable display device where a product cost decreases and a degree of design freedom increases by sensing a folding state and an unfolding state using a capacitive pattern on a display panel.

Discussion of the Related Art

Recently, as the information society progresses, display devices processing and displaying a large amount of information have rapidly advanced and various flat panel displays (FPDs) have been developed. Specifically, the FPDs such as a liquid crystal display (LCD) device, a plasma display panel (PDP) device, an organic light emitting diode (OLED) display device and a field emission display (FED) device having superior performance with a thin profile, a light weight, and a low power consumption have substituted for a cathode ray tube (CRT).

Since the FPD uses a glass substrate resistant to the heat of a fabrication process, there exists a limit to the light weight, the thin profile and the flexibility of the FPD.

As a result, a flexible display device which performs a display function even when bent by using a flexible material such as plastic instead of the glass has been researched as the next generation FPD.

The flexible display devices can be classified into: an unbreakable display device which has a relatively high durability; a bendable display device which is capable of being bent; a rollable display device which is capable of being rolled; and a foldable display device which is capable of being folded. The flexible display device has advantages in a space application and interior decoration and design and has various applications.

Specifically, a foldable display device that is portable in a folding state and displays an image in an unfolding state has been researched for an ultra thin profile, a light weight and a portable size having a large display area.

The foldable display device can be applied to a television and a monitor as well as a mobile phone, an ultra mobile personal computer, an electronic book and an electronic news paper.

In the foldable display device, a folding state and an unfolding state are sensed using an exclusive sensor attached to an exterior frame. However, a product cost increases due to the exclusive sensor.

In addition, since the exclusive sensor is attached to the exterior frame, a degree of a design freedom of the frame or the foldable display device is limited.

SUMMARY OF THE INVENTION

Accordingly, the present invention is directed to a foldable display device and a method of driving the foldable display device that substantially obviate one or more of the problems due to limitations and disadvantages of the related art.

An object of the present invention is to provide a foldable display device where a product cost decreases and a degree of design freedom increases by sensing a folding state and an unfolding state using a capacitive pattern on a display panel and a method of driving the foldable display device.

Another object of the present invention is to provide a foldable display device where a power consumption is reduced by driving a driving unit and a display panel according to a sensing result of a folding state and an unfolding state by a capacitive pattern on the display panel and a method of driving the foldable display device.

Additional features and advantages of the invention will be set forth in the description which follows, and in part will be apparent from the description, or can be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a foldable display device includes a display panel having a display area including a plurality of pixels and a non-display area surrounding the display area; a first base pattern in the non-display area; a first capacitive pattern in the non-display area, the first capacitance pattern forming a first capacitance with the first base pattern; a driving unit generating a comparison signal corresponding to the first capacitance; and a calculating unit sensing an unfolding state and a folding state of the display panel using the comparison signal.

In another aspect, a method of driving a foldable display device includes supplying a base voltage and a first capacitive signal to a first base pattern and a first capacitive pattern, respectively, in a non-display area of a display panel; generating a comparison signal by comparing a second capacitive signal delayed due to a first capacitance between the first base pattern and the first capacitive pattern with a reference voltage; and sensing an unfolding state and a folding state of the display panel by counting a width of a high level of the comparison signal.

It is to be understood that both the foregoing general description and the following detailed description are exemplary and explanatory and are intended to provide further explanation of the embodiments as claimed.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the disclosure. In the drawings.

DETAILED DESCRIPTION OF THE EMBODIMENTS

Reference will now be made in detail to the preferred embodiments, examples of which are illustrated in the accompanying drawings.

Figure 1:
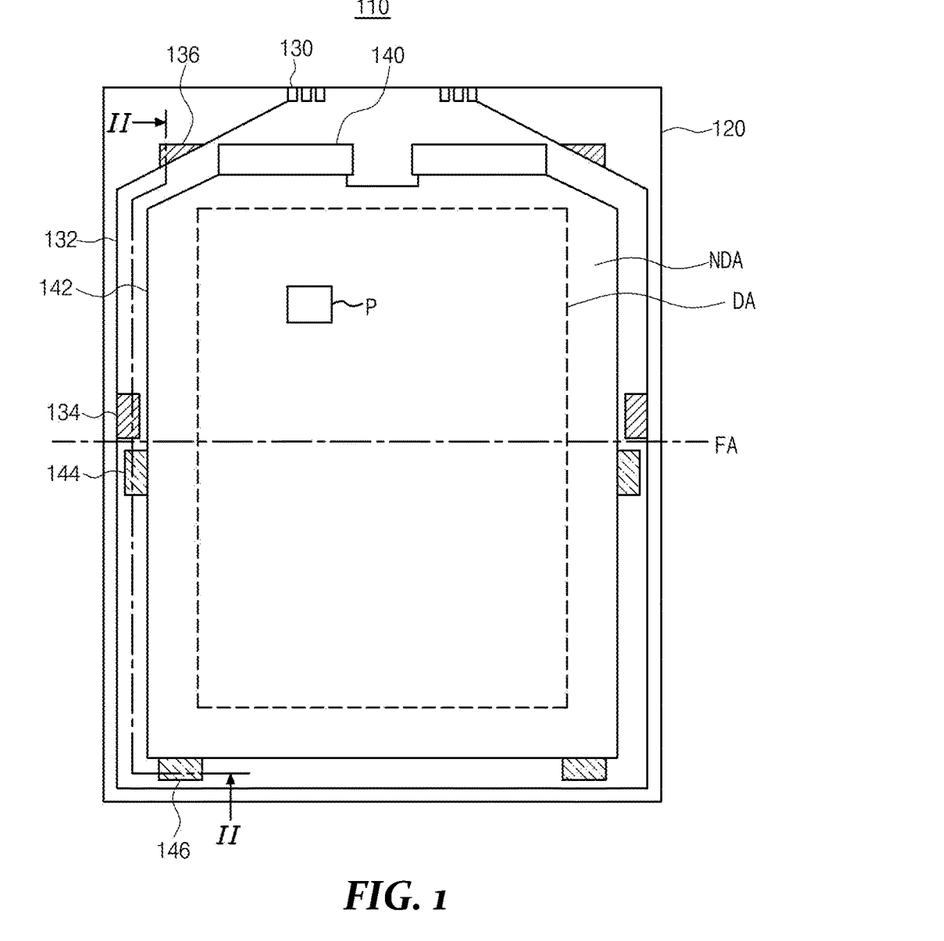
FIG. 1 is a plan view showing a foldable display device according to a first embodiment of the present disclosure.

FIG. 1 is a plan view showing a foldable display device according to a first embodiment of the present disclosure. All the components of the foldable display device according to all embodiments of the present disclosure are operatively coupled and configured.

In FIG. 1, a foldable display device 110 according to the first embodiment of the present disclosure includes a timing controlling unit 150 (e.g., see FIG. 3), a micro-controlling unit (MCU), a driving unit 140 and a display panel 120. The display panel 120 can include an organic light emitting diode (OLED) display panel or a liquid crystal display (LCD) panel.

The timing controlling unit 150 generates an image data, a data control signal and a gate control signal using an image signal and a plurality of timing signals such as a data enable, a horizontal synchronization signal, a vertical synchronization signal and a clock transmitted from an external system such as a graphic card or a television system. The timing controlling unit 150 transmits the image data, the data control signal and the gate control signal to the driving unit 140.

The timing controlling unit 150 receives a comparison signal CS (e.g., see FIG. 3) from the driving unit 140 and generates a mode signal according to an operation mode of the driving unit 140 and the display panel 120 using the comparison signal CS. The timing controlling unit 150 transmits the mode signal to the micro-controlling unit. The timing controlling unit 150 includes a calculating unit or part 152 (e.g., see FIG. 3) which counts a specific period of the comparison signal CS and judges a folding state and an unfolding state of the display panel 120.

The micro-controlling unit drives the driving unit 140 and the display panel 120 in the operation mode according to the mode signal transmitted from the timing controlling unit 150.

The driving unit 140 generates a data voltage using the data control signal and the image data transmitted from the timing controlling unit 150 and applies the data voltage to a pixel electrode of each pixel P through a data line and a thin film transistor of the display panel 120.

The driving unit 140 generates a gate voltage using the gate control signal transmitted from the timing controlling unit 150 and applies the gate voltage to a gate line of the display panel 120.

The driving unit 140 generates a first capacitive signal SS1 (e.g., see FIG. 3) for sensing a folding state and an unfolding state and supplies the first capacitive signal SS1 to one end of a capacitive line 142 of the display panel 120. The driving unit 140 generates the comparison signal CS using a second capacitive signal SS2 (e.g., see FIG. 3) outputted from the other end of the capacitive line 142 and transmits the comparison signal CS to the timing controlling unit 150.

The driving unit 140 can be mounted on the display panel 120 and can include at least one driving integrated circuit (DIC).

The display panel 120 displays an image using the gate voltage and the data voltage. The display panel 120 includes a gate line, a data line and a pixel P connected to the gate line and the data line. The gate line and the data line cross each other to define the pixel P.

When the foldable display device 110 is an organic light emitting diode (OLED) display device, the pixel P of the display panel 120 can include a switching thin film transistor (TFT), a driving TFT, a storage capacitor and a light emitting diode. When the foldable display device 110 is a liquid crystal display (LCD) device, the pixel P of the display panel 120 can include a TFT, a storage capacitor and a liquid crystal capacitor.

The display panel 120 includes a display area DA displaying an image and including the plurality of pixels P and a non-display area NDA surrounding the display area DA.

A plurality of pads 130 can be disposed in an upper side portion of the non-display area NDA of the display panel 120. A base line 132 and a capacitive line 142 inside the base line 132 can be disposed in a left side portion and a lower side portion of the non-display area NDA of the display panel 120. Both ends of the base line 132 are connected to the plurality of pads 130, and both ends of the capacitive line 142 are connected to the driving unit 140.

A base voltage Vss (e.g., see FIG. 3) can be supplied to the base line 132 through the plurality of pads 130. A first capacitive signal SS1 can be supplied from the driving unit 140 to the one end of the capacitive line 142, and a second capacitive signal SS2 can be outputted from the other end of the capacitive line 142 to the driving unit 140.

A first base pattern 134 and a first capacitive pattern 144 can be disposed in the left side portion and the right side portion of the non-display area NDA of the display panel 120. The first base pattern 134 can be connected to the base line 132. The first capacitive pattern 144 can be disposed symmetrically to the first base pattern 134 with respect to a folding axis FA and can be connected to the capacitive line 142.

At least one first base pattern 134 and at least one first capacitive pattern 144 can be disposed in the left side portion and the right side portion.

A second base pattern 136 connected to the base line 132 can be disposed in the upper side portion of the non-display area NDA of the display panel 120. A second capacitive pattern 146 can be disposed in the lower side portion of the non-display area NDA of the display panel 120. The second capacitive pattern 146 can be disposed symmetrically to the second base pattern 136 with respect to the folding axis FA and can be connected to the capacitive line 142.

At least one second base pattern 136 can be disposed in the upper side portion and at least one second capacitive pattern 146 can be disposed in the lower side portion.

Each of the first and second base patterns 134 and 136 and the first and second capacitive patterns 144 and 146 can have a plate shape.

The base line 132, the capacitive line 142, the first and second base patterns 134 and 136 and the first and second capacitive patterns 144 and 146 can include the same material as a conductive layer of the TFT in the pixel P through the same process.

The foldable display device 110 can have an unfolding state (e.g., be in the unfolding state) where the display panel 120 is unfolded up and down with respect to the folding axis FA, whereas the foldable display device 110 can have a folding state (e.g., be in the foldable state) where the display panel 120 is folded with respect to the folding axis FA. A first capacitance between the first base pattern 134 and the first capacitive pattern 144 in the unfolding state is different from the first capacitance between the first base pattern 134 and the first capacitive pattern 144 in the folding state, and a second capacitance between the second base pattern 136 and the second capacitive pattern 146 in the unfolding state is different from the second capacitance between the second base pattern 136 and the second capacitive pattern 146 in the folding state. As a result, the unfolding state and the folding state can be sensed from a change of the first or second capacitance.

The unfolding state and the folding state of the display panel 120 will be illustrated and discussed with reference to drawings.

Figure 2A:
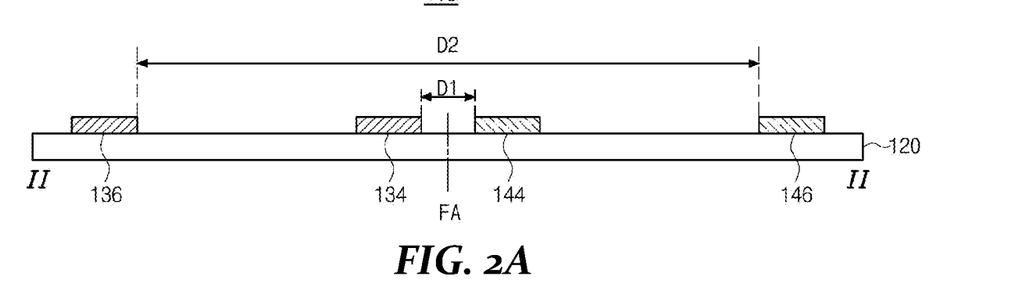
FIGS. 2A and 2B are cross-sectional views showing an unfolding state and a folding state, respectively, of the foldable display device according to the first embodiment of the present disclosure.
Figure 2B:
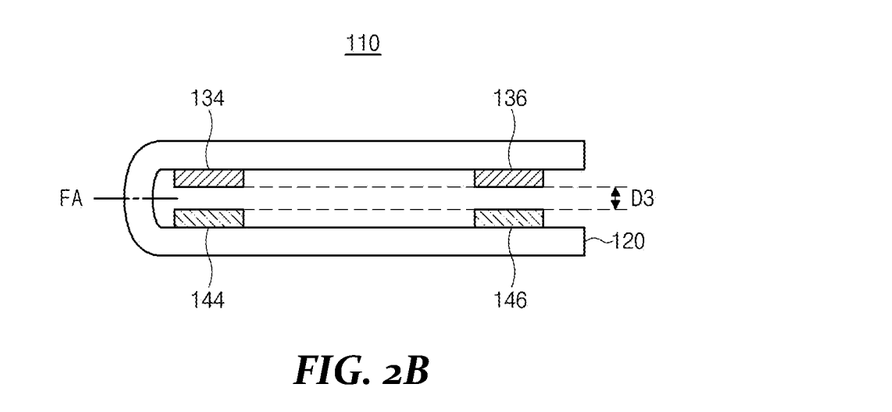

FIGS. 2A and 2B are cross-sectional views showing an unfolding state and a folding state, respectively, of the foldable display device of FIG. 1 according to the first embodiment of the present disclosure. FIGS. 2A and 2B are taken along a line II-II of FIG. 1, and the unfolding state and the folding state will be illustrated with reference to FIGS. 2A and 2B together with FIG. 1.

In FIG. 2A, when the foldable display device 110 according to the first embodiment of the present disclosure has the unfolding state, the display panel 120 is unfolded up and down with reference to the folding axis FA. As a result, the first base pattern 134 and the first capacitive pattern 144 are separated from each other by a first distance D1, and the second base pattern 136 and the second capacitive pattern 146 are separated from each other by a second distance D2.

Accordingly, an unfolding capacitance corresponding to a sum of a first capacitance between the first base pattern 134 and the first capacitive pattern 144 and a second capacitance between the second base pattern 136 and the second capacitive pattern 146 can be formed between the base line 132 and the capacitive line 142. The first and second capacitances can be connected in parallel between the base line 132 and the capacitive line 142.

In FIG. 2B, when the foldable display device 110 according to the first embodiment of the present disclosure has the folding state, the display panel 120 is folded with reference to the folding axis FA. As a result, the first base pattern 134 and the first capacitive pattern 144 are separated from each other by a third distance D3, and the second base pattern 136 and the second capacitive pattern 146 are separated from each other by the third distance D3.

As the foldable display device 110 switches from the unfolding state to the folding state, a facing area between the first base pattern 134 and the first capacitive pattern 144 increases such that the first capacitance between the first base pattern 134 and the first capacitive pattern 144 increases.

Further, as the foldable display device 110 switches from the unfolding state to the folding state, the second distance D2 between the second base pattern 136 and the second capacitive pattern 146 decreases to become the third distance D3 and a facing area between the second base pattern 136 and the second capacitive pattern 146 increases such that the second capacitance between the second base pattern 136 and the second capacitive pattern 146 increases.

Accordingly, each of the first capacitance between the first base pattern 134 and the first capacitive pattern 144 and the second capacitance between the second base pattern 136 and the second capacitive pattern 146 increases, and a folding capacitance corresponding to a sum of the first capacitance between the first base pattern 134 and the first capacitive pattern 144 and the second capacitance between the second base pattern 136 and the second capacitive pattern 146 and greater than the unfolding capacitance is formed between the base line 132 and the capacitive line 142.

In the foldable display device 110, the unfolding state and the folding state can be sensed by analyzing a change of the unfolding capacitance of the unfolding state and the folding capacitance of the folding state.

Figure 3:
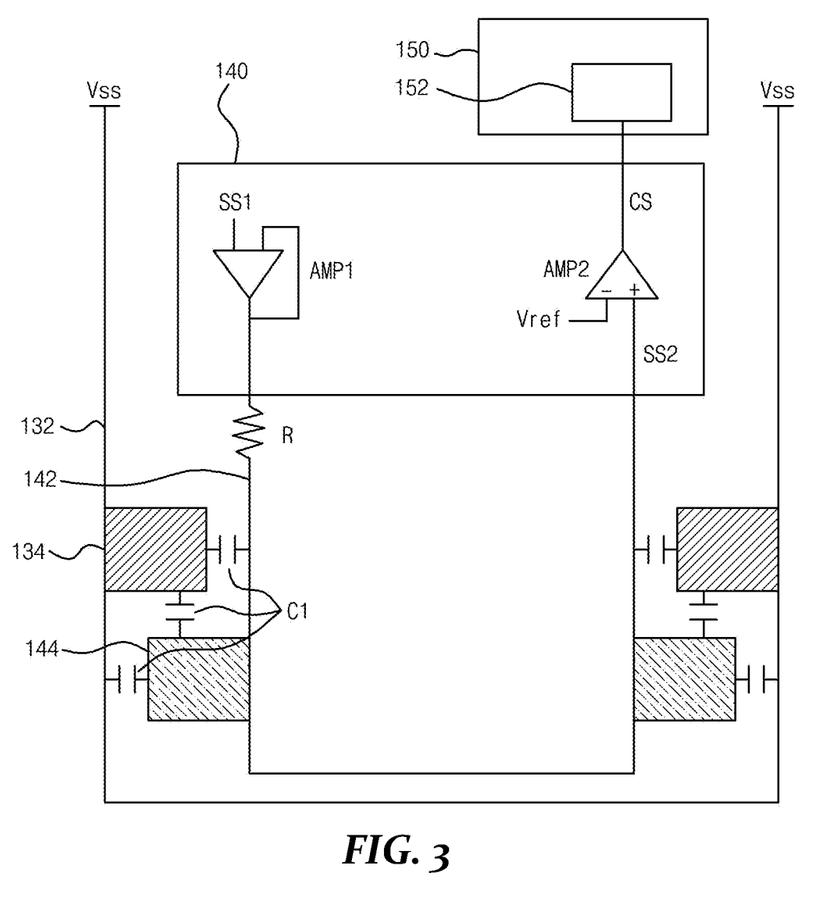
FIG. 3 is a view showing a process of sensing an unfolding state and a folding state of the foldable display device according to the first embodiment of the present disclosure.
Figure 4A:
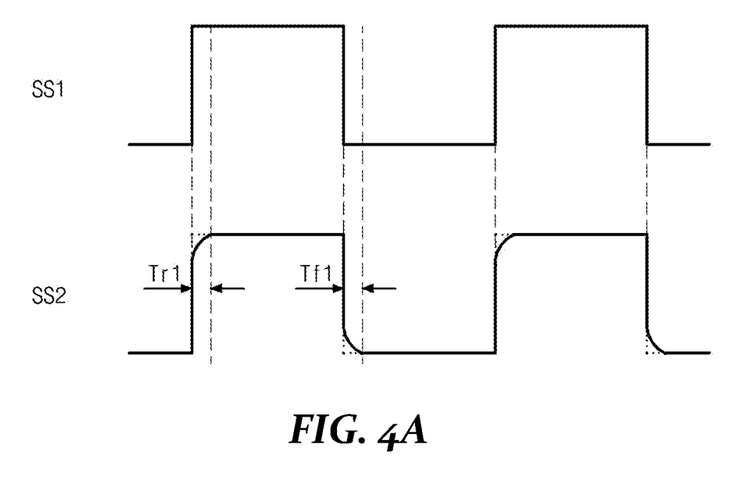
FIG. 4A is a waveform showing first and second capacitive signals of an unfolding state of the foldable display device according to the first embodiment of the present disclosure.
Figure 4B:
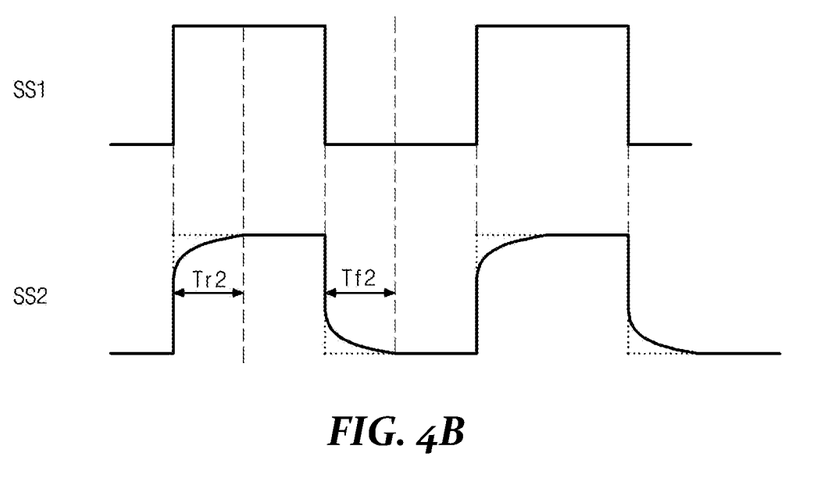
FIG. 4B is a waveform showing first and second capacitive signals of a folding state of the foldable display device according to the first embodiment of the present disclosure.
Figure 5:
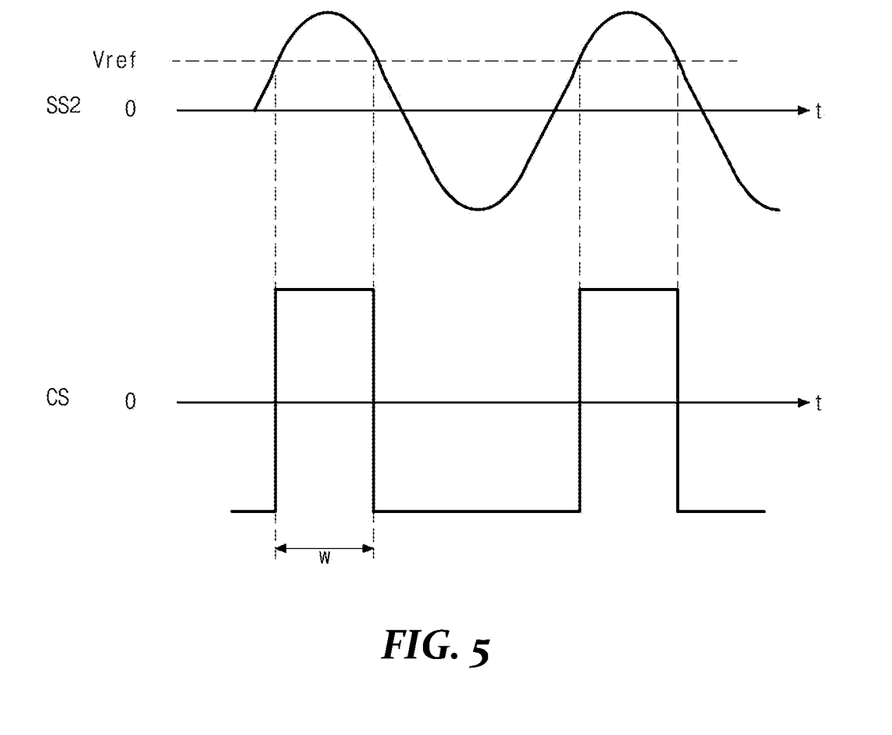
FIG. 5 is a waveform showing a second capacitive signal and a comparison signal of the foldable display device according to the first embodiment of the present disclosure.

FIG. 3 is a view showing a process of sensing an unfolding state and a folding state of the foldable display device according to the first embodiment of the present disclosure. FIG. 4A is a waveform showing first and second capacitive signals of an unfolding state of the foldable display device according to the first embodiment of the present disclosure, and FIG. 4B is a waveform showing first and second capacitive signals of a folding state of the foldable display device according to the first embodiment of the present disclosure. FIG. 5 is a waveform showing a second capacitive signal and a comparison signal of the foldable display device according to the first embodiment of the present disclosure.

In FIG. 3, the driving unit 140 of the foldable display device 110 according to the first embodiment of the present disclosure supplies a first capacitive signal SS1 to one end of the capacitive line 142 and receives a second capacitive signal SS2 from the other end of the capacitive line 142. The driving unit 140 generates a comparison signal CS using the second capacitive signal SS2 and transmits the comparison signal CS to a timing controlling unit 150. A calculating part 152 of the timing controlling unit 150 judges the unfolding state and the folding state of the display panel 120 using the comparison signal CS.

The driving unit 140 generates the first capacitive signal SS1 of a square wave. After the driving unit 140 amplifying the first capacitive signal SS1 using a first amplifier AMP1, the driving unit 140 supplies the amplified first capacitive signal SS1 to one end of the capacitive line 142.

The first capacitance C1 is formed between the first base pattern 134 and the capacitive line 142, between the first base pattern 134 and the first capacitive pattern 144 and between the base line 132 and the first capacitive pattern 144. Since the capacitive line 142 has a resistance R, the capacitive line 142 has a delay corresponding to a product of the first capacitance C1 and the resistance R.

As a result, the first capacitive signal SS1 having a rising time of 0 and a falling time of 0 becomes the second capacitive signal SS2 having a rising time not equal to 0 and a falling time not equal to 0. The second capacitive signal SS2 is outputted from the other end of the capacitive line 142.

In FIGS. 4A and 4B, when the display panel 120 has the unfolding state corresponding to the first capacitance C1 of a relatively small value, the second capacitive signal SS2 has a first rising time Tr1 and a first falling time Tf1. When the display panel 120 has the folding state corresponding to the first capacitance C1 of a relatively great value, the second capacitive signal SS2 has a second rising time Tr2 greater than the first rising time Tr1 and a second falling time Tf2 greater than the first falling time Tf1 (Tr1<Tr2, Tf1<Tf2).

The driving unit 140 receives the second capacitive signal SS2 from the other end of the capacitive line 142. The driving unit 140 compares the second capacitive signal SS2 transmitted through a second amplifier AMP2 used as a comparator with a reference voltage Vref and generates the comparison signal CS corresponding to a comparison result.

The second capacitive signal SS2 is inputted to a non-inverted input + of the second amplifier AMP2, the reference voltage Vref is inputted to an inverted input − of the second amplifier AMP2, and the comparison signal CS is outputted from an output of the second amplifier AMP2.

In FIG. 5, the second amplifier AMP2 can generate the comparison signal CS of a square wave. The comparison signal CS has a high level when the second capacitive signal SS2 is equal to or greater than the reference voltage Vref and has a low level when the second capacitive signal SS2 is smaller than the reference voltage Vref.

When the display panel 120 has the unfolding state, the second capacitive signal SS2 has the first rising time Tr1 of a relatively small value and the first falling time Tf1 of a relatively small value. As a result, the comparison signal CS can have a width w of a relatively great value.

When the display panel 120 has the folding state, the second capacitive signal SS2 has the second rising time Tr2 of a relatively great value and the second falling time Tf2 of a relatively great value. As a result, the comparison signal CS can have a width w of a relatively small value.

The width w of the comparison signal CS of the unfolding state of the display panel 120 can be greater than the width w of the comparison signal CS of the folding state of the display panel 120.

The calculating part 152 of the timing controlling unit 150 counts the width w of the high level of the comparison signal CS and judges the unfolding state and the folding state of the display panel 120 according to a counting result.

The timing controlling unit 150 generates a mode signal according to a judging result of the calculating part 152 and transmits the mode signal to a micro-controlling unit.

Although the calculating part 152 is exemplarily disposed in the timing controlling unit 150 in the first embodiment, the calculating part 152 can be disposed in the driving unit 140 or in another component in another embodiment.

The micro-controlling unit drives the driving unit 140 and the display panel 120 in the operation mode according to the mode signal transmitted from the timing controlling unit 150.

For example, when the display panel 120 has the unfolding state, the micro-controlling unit can drive the driving unit 140 and the display panel 120 such that the driving unit 140 periodically generates the first capacitive signal SS1 to supply the first capacitive signal SS1 to the capacitive line 142 and generates a gate voltage and a data voltage and the display panel 120 displays an image using the gate voltage and the data voltage.

When the display panel 120 has the folding state, the micro-controlling unit can drive the driving unit 140 and the display panel 120 such that the driving unit 140 periodically generates the first capacitive signal SS1 to supply the first capacitive signal SS1 to the capacitive line 142 and does not generate a gate voltage and a data voltage and the display panel 120 does not display the image.

Although the micro-controlling unit exemplarily drives the driving unit 140 and the display panel 120 in the first embodiment, the micro-controlling unit can be omitted and the timing controlling unit 150 can drive the driving unit 140 and the display panel 120 in another embodiment.

In the foldable display device 110 according to the first embodiment of the present disclosure, since the unfolding state and the folding state of the display panel 120 are sensed using the first and second capacitive patterns 144 and 146 which are formed on the display panel 120 through the same process as the pixel P without an exclusive sensor, a product cost decreases and a degree of design freedom increases.

In addition, since the driving unit 140 and the display panel 120 are differently driven according to the sensing result of the unfolding state and the folding state of the display panel 120, the power consumption is reduced.

The base pattern and the capacitive pattern can have a shape of a plurality of bars in another embodiment.

Figure 6:
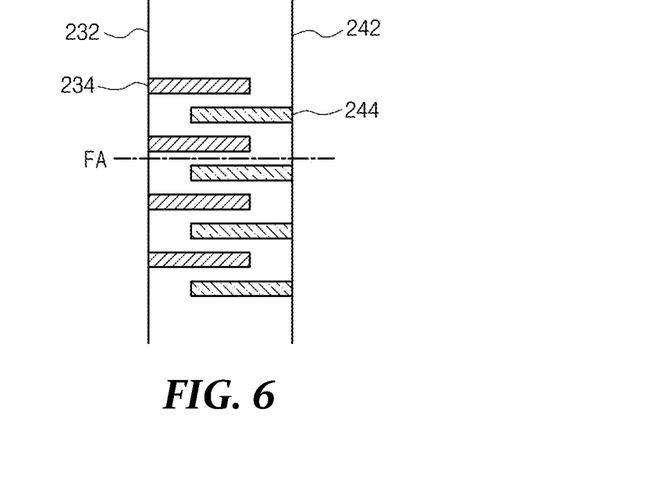
FIG. 6 is a plan view showing a base pattern and a capacitive pattern of a foldable display device according to a second embodiment of the present disclosure.
Figure 7A:
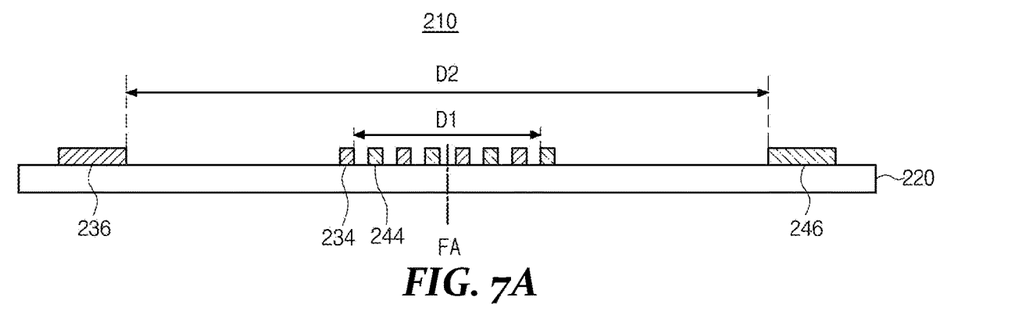
FIGS. 7A and 7B are cross-sectional views showing an unfolding state and a folding state, respectively, of the foldable display device according to the second embodiment of the present disclosure.
Figure 7B:
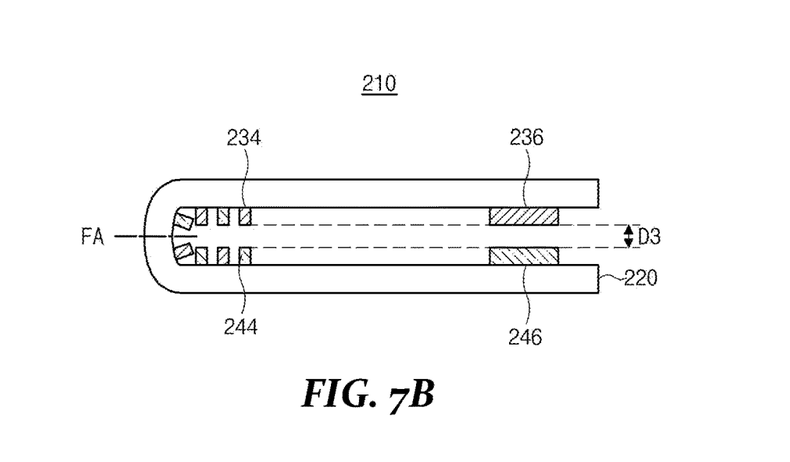

FIG. 6 is a plan view showing a base pattern and a capacitive pattern of a foldable display device according to a second embodiment of the present disclosure, and FIGS. 7A and 7B are cross-sectional views showing an unfolding state and a folding state, respectively, of the foldable display device of FIG. 6 according to the second embodiment of the present disclosure. Illustration for the parts that are the same as the first embodiment will be omitted (or may be brief) where different parts between the first and second embodiments may be discussed or focused below.

In FIG. 6, a base line 232, a capacitive line 242, a first base pattern 234 and a second capacitive line 244 can be disposed in a non-display area of a display panel of a foldable display device according to the second embodiment of the present disclosure. The first base pattern 234 is connected to the base line 232, and the first capacitive pattern 244 is connected to the capacitive line 242.

Each of the first base pattern 234 and the first capacitive pattern 244 has a shape of a plurality of bars. The plurality of bars of the first base pattern 234 and the plurality of bars of the first capacitive pattern 244 can be inserted into each other to be alternately disposed with each other.

Each of the first base pattern 234 and the first capacitive pattern 244 can be symmetrically disposed with respect to a folding axis FA.

In FIG. 7A, when a foldable display device 210 according to the second embodiment of the present disclosure has an unfolding state, a display panel 220 is unfolded up and down with reference to the folding axis FA. As a result, a left outermost bar of the first base pattern 234 and a right outermost bar of the first capacitive pattern 244 are separated from each other by a first distance D1, and a second base pattern 236 and a second capacitive pattern 246 are separated from each other by a second distance D2.

Accordingly, an unfolding capacitance corresponding to a sum of a first capacitance between the plurality of bars of the first base pattern 234 and the plurality of bars of the first capacitive pattern 244 and a second capacitance between the second base pattern 236 and the second capacitive pattern 246 can be formed between the base line 232 and the capacitive line 242. The first and second capacitances can be connected in parallel between the base line 232 and the capacitive line 242.

In FIG. 7B, when the foldable display device 210 according to the second embodiment of the present disclosure has the folding state, the display panel 220 is folded with reference to the folding axis FA. As a result, the first base pattern 234 and the first capacitive pattern 244 are separated from each other by a third distance D3, and the second base pattern 236 and the second capacitive pattern 246 are separated from each other by the third distance D3.

As the foldable display device 210 switches from the unfolding state to the folding state, the first distance D1 between a left outermost bar of the first base pattern 234 and a right outermost bar of the first capacitive pattern 244 is reduced to become the third distance D3 and a facing area between the first base pattern 234 and the first capacitive pattern 244 increases such that the first capacitance between the first base pattern 234 and the first capacitive pattern 244 increases.

Further, as the foldable display device 210 switches from the unfolding state to the folding state, the second distance D2 between the second base pattern 236 and the second capacitive pattern 246 decreases to become the third distance D3 and a facing area between the second base pattern 236 and the second capacitive pattern 246 increases such that the second capacitance between the second base pattern 236 and the second capacitive pattern 246 increases.

Accordingly, each of the first capacitance between the first base pattern 234 and the first capacitive pattern 244 and the second capacitance between the second base pattern 236 and the second capacitive pattern 246 increases, and a folding capacitance corresponding to a sum of the first capacitance between the first base pattern 234 and the first capacitive pattern 244 and the second capacitance between the second base pattern 236 and the second capacitive pattern 246 and greater than the unfolding capacitance is formed between the base line 232 and the capacitive line 242.

In the foldable display device 210 according to the second embodiment of the present disclosure, since each of the first base pattern 234 and the first capacitive pattern 244 includes the plurality of bars, the first capacitance between the first base pattern 234 and the first capacitive pattern 244 is changed by the decrease of distance as well as the increase of area when the unfolding state is switched to the folding state.

As a result, the change magnitude of the first capacitance of the second embodiment can be greater than the change magnitude of the first capacitance of the first embodiment, and the sensing accuracy of the unfolding state and the folding state increases.

In the foldable display device 210 according to the second embodiment of the present disclosure, since the unfolding state and the folding state of the display panel 220 are sensed using the first and second capacitive patterns 244 and 246 which are formed on the display panel 220 through the same process as the pixel P without an exclusive sensor, a product cost decreases and a degree of design freedom increases.

In addition, since the driving unit and the display panel 220 are differently driven according to the sensing result of the unfolding state and the folding state of the display panel 220, the power consumption is reduced.

Further, since each of the first base pattern 234 and the first capacitive pattern 244 includes the plurality of bars, the change magnitude of the first capacitance increases and the sensing accuracy of the unfolding state and the folding state increases.

It will be apparent to those skilled in the art that various modifications and variations can be made in a foldable display device of the present disclosure without departing from the spirit or scope of the disclosure. Thus, it is intended that the present disclosure covers the modifications and variations of these embodiments provided they come within the scope of the appended claims and their equivalents.

What is claimed is:

1. A foldable display device comprising:
    a display panel having a display area including a plurality of pixels and a non-display area surrounding the display area;
    a first base pattern in the non-display area;
    a first capacitive pattern in the non-display area, the first capacitance pattern forming a first capacitance with the first base pattern;
    a driving circuit configured to generate a comparison signal corresponding to the first capacitance; and
    a calculating circuit configured to sense an unfolding state and a folding state of the display panel using the comparison signal,
    wherein each of the first base pattern and the first capacitive pattern includes a same material as a conductive layer of a thin film transistor in each of the plurality of pixels.

2. The foldable display device of claim 1, further comprising:
    a base line connected to the first base pattern and configured to transmit a base voltage to the first base pattern; and
    a capacitive line connected to the first capacitive pattern and configured to transmit a first capacitive signal to the first capacitive pattern.

3. The foldable display device of claim 2, wherein the driving circuit supplies the first capacitive signal to a first end of the capacitive line, and receives a second capacitive signal from a second end of the capacitive line.

4. The foldable display device of claim 3, wherein the driving circuit comprises:
    a first amplifier connected to the first end of the capacitive line and amplifying the first capacitive signal; and
    a second amplifier connected to the second end of the capacitive line and outputting a comparison signal by comparing the second capacitive signal with a reference voltage.

5. The foldable display device of claim 4, wherein the calculating circuit counts a width of a high level of the comparison signal and judges the unfolding state and the folding state of the display panel according to a counting result.

6. The foldable display device of claim 1, wherein each of the first base pattern and the first capacitive pattern has a plate shape, and
    wherein the first base pattern and the first capacitive pattern are disposed symmetrically to each other with respect to a folding axis of the display panel.

7. The foldable display device of claim 1, wherein each of the first base pattern and the first capacitive pattern has a shape of a plurality of bars,
    wherein the plurality of bars of the first base pattern and the plurality of bars of the first capacitive pattern are inserted into each other to be alternately disposed with each other, and
    wherein each of the first base pattern and the first capacitive pattern is symmetrically disposed with respect to a folding axis of the display panel.

8. The foldable display device of claim 7, wherein the display panel is divided into an upper region and a lower region by the folding axis,
    wherein the plurality of bars of the first base pattern are disposed both in the upper region and the lower region, and wherein the plurality of bars of the first capacitive pattern are disposed both in the upper region and the lower region.

9. The foldable display device of claim 8, wherein when the display panel is folded with respect to the folding axis, the plurality of bars of the first base pattern in the upper region face into the plurality of bars of the first capacitive pattern in the lower region, and wherein the plurality of bars of the first capacitive pattern in the upper region face into the plurality of bars of the first base pattern in the lower region.

10. The foldable display device of claim 1, further comprising:

a second base pattern in an upper side portion of the non-display area; and a second capacitive pattern in a lower side portion of the non-display area, the second capacitive pattern disposed symmetrically to the second base pattern with respect to a folding axis of the display panel.

11. A method of driving a foldable display device, the method comprising:

supplying a base voltage and a first capacitive signal to a first base pattern and a first capacitive pattern, respectively, in a non-display area of a display panel of the foldable display device;

generating a comparison signal by comparing a second capacitive signal delayed due to a first capacitance between the first base pattern and the first capacitive pattern with a reference voltage; and sensing an unfolding state and a folding state of the display panel by counting a width of a high level of the comparison signal, wherein each of the first base pattern and the first capacitive pattern includes a same material as a conductive layer of a thin film transistor in each of the plurality of pixels.

12. The method of claim 11, further comprising:

performing an image displaying when the display panel is in the unfolding state; and stopping the image displaying when the display panel is in the folding state.

* * * * *